United States Patent [19]

Yahata et al.

[11] 4,149,258

[45] Apr. 10, 1979

[54] DIGITAL FILTER SYSTEM HAVING FILTERS SYNCHRONIZED BY THE SAME CLOCK SIGNAL

[75] Inventors: Haruki Yahata; Shunsuke Honda, both of Yokohama; Tadamichi Kawasaki, Kawasaki, all of Japan

[73] Assignee: Tokyo Shibaura Electric Co., Ltd., Kawasaki, Japan

[21] Appl. No.: 862,183

[22] Filed: Dec. 19, 1977

[30] Foreign Application Priority Data

Dec. 20, 1976 [JP] Japan .................................. 51-151934

[51] Int. Cl.² ........................................... G06F 15/34
[52] U.S. Cl. .................................................. 364/724
[58] Field of Search ........................... 364/724; 325/42

[56] References Cited

U.S. PATENT DOCUMENTS

| | | | |
|---|---|---|---|
| 3,706,076 | 12/1972 | Schuster | 364/724 |
| 3,961,167 | 6/1976 | Mills | 364/724 |
| 3,988,607 | 10/1976 | Eggermont et al. | 364/724 |
| 3,997,773 | 12/1976 | Essen et al. | 364/724 X |

OTHER PUBLICATIONS

Leon et al. "A Laboratory for Digital Filter Instructions", *IEEE Trans. on Circuits and Systems* vol. CAS-23, No. 4, pp. 217-218 Apr. 1976.

*Primary Examiner*—David H. Malzahn
*Attorney, Agent, or Firm*—Oblon, Fisher, Spivak, McClelland & Maier

[57] ABSTRACT

A digital filter system comprising a plurality of digital filters having respective counters operated by the same clock signal, at least one of these digital filters including an operation control section having a counter to count the clock signal and be cleared with a clear signal and a circuit to produce a control signal according to the content of the aforesaid counter, an ROM to provide predetermined coefficients according to the output of the arithmetic control section, an arithmetic section to carry out predetermined arithmetic operations with the above predetermined coefficients under the control of the control signal received from the arithmetic control section, a delay memory section, a switching device controlled for switching to execute the arithmetic operations under the control of the control signal received at the time of execution of the operations, and a circuit to produce a synchronizing signal at the time of the end of the operations in the aforesaid filter, said synchronizing signal being supplied to the clear terminals of the counters of all the other digital filters to effect synchronization of all the digital filters.

8 Claims, 8 Drawing Figures

DIGITAL FILTER SYSTEM HAVING FILTERS SYNCHRONIZED BY THE SAME CLOCK SIGNAL

BACKGROUND OF THE INVENTION

This invention relates to a digital filter system, which is provided in an information transmission system and comprises a plurality of digital filters including respective counters operated by the same clock signal.

Digital filters have similar functions to those of analog filters except for that they execute operations to obtain digital values. Where the speed of operation of such digital filters is sufficiently high compared to the speed of input signal sampling, effective utility of these digital filters is possible by incorporating multi-filter arrangement of multi-channel arrangement, these arrangements using a filter circuit based upon a time division basis, or combination of such arrangements. In the multi-filter arrangement, a higher order filter is constituted by repeatedly processing a single input signal through unit blocks of lower order filters (usually of the second order and of cascade connection or parallel connection). However, limitations are imposed upon this multiplex construction by such factors as the upper limit of the operation speed of the unit block, and lower limit of the data sampling speed and the required order of the digital filter (determined by the characteristics of the required filters). From this ground, it is sometimes necessary to use a plurality of digital filters.

In the multi-channel arrangement, a plurality of independent channel signals are processed with a single digital filter. Again in this case, however, it is sometimes necessary to use a plurality of digital filters from the same grounds as in the case of the multi-filter arrangement.

In such cases as above where a plurality of digital filters are employed in an information transmission system, it is usually necessary to provide synchronization among these filters. It is in usual practice in the digital filter to externally supply a clock signal as reference signal and produce various gate signals and clock signals required for the operations within the filter. To this end, however, a considerable number of arithmetic control circuits are required particularly in the aforementioned multiplex construction. In this case, unless the individual arithmetic control circuits of the digital filters are synchronized to one another, erroneous transmission and reception of signals among the mutual digital filters are liable, thus giving rise to malfunction and erroneous operations.

Accordingly, it is contemplated to supply, for instance, a start signal, i.e., initial clear signal, simultaneously to these digital filters for synchronization. With this method, however, once departure from the synchronization results due to noise or other causes, the subsequent operations are totally done erroneously so that normal filter function is no longer obtained. In addition, with this method unless the start signal is given in exact synchronism to the clock signal, the content of the counter within each digital filter is likely to be shifted by one pulse due to the difference in sensitivity among the elements of flip-flops constituting the counter, and this also causes lowering of the filter function.

SUMMARY OF THE INVENTION

An object of the invention, accordingly, is to provide a digital filter system, in which a plurality of digital filters can always and accurately be synchronized to one another, and also in which even if departure from the synchroniztion takes place the synchronized state can be reliably recovered after a predetermined period of time.

The invention features a digital filter system, which comprises a plurality of digital filters having respective counters operated by the same clock signal, at least one of these digital filters including an arithmetic control section having a counter to count the clock signal and be cleared with a clear signal and a circuit to produce a control signal according to the content of the aforesaid counter, a coefficient memory to provide predetermined coefficients according to the output of the arithmetic control section, an arithmetic section to carry out predetermined arithmetic operations with these predetermined operations under the control of the control signal received from the arithmetic control section, and a circuit to produce a synchronizing signal at the time of the end of the operations in the aforesaid filters, said synchronizing signal being supplied to the clear terminals of the counters of all the other digital filters to effect synchronization among all the digital filters.

BRIEF DESCRIPTION OF THE DRAWINGS

Objects and advantages other than those above set forth will be apparent from the following description when read in connection with the accompanying drawings, in which.

DETAILED DESCRIPTION OF THE PREFERRED EMBODIMENTS

Figure 1:
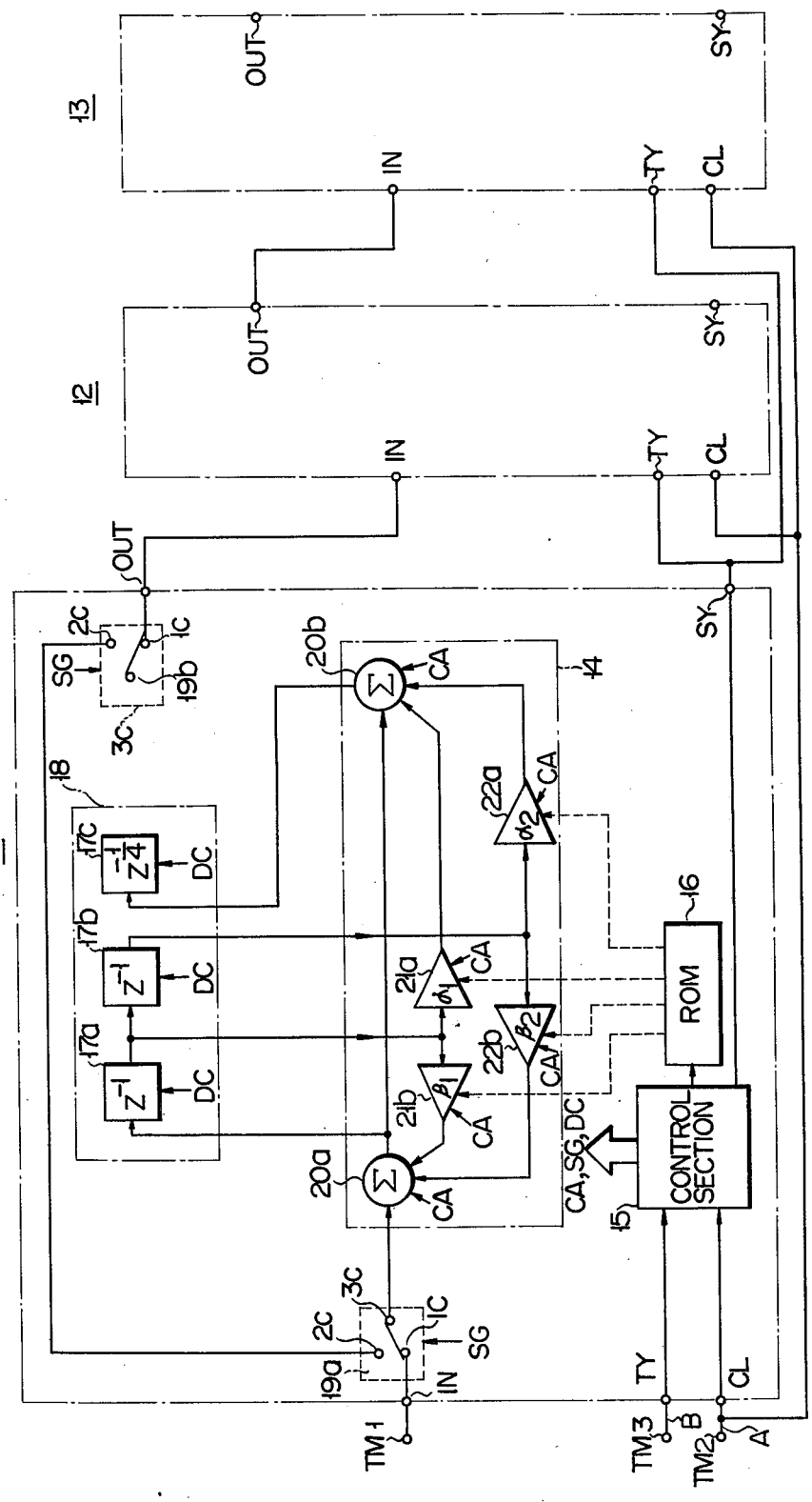
FIG. 1 is a block diagram showing an embodiment of the digital filter system according to the invention.

FIG. 1 shows an embodiment of the invention applied to the case of a multi-filter arrangement with three digital filters connected in cascade. The three digital filters 11, 12 and 13 have the same filter function and circulation type digital filters with multiplex degree of M (for instance 4) consisting of respective second order cascade connected unit blocks. Also, they have the same operation period. One of these digital filters, for instance filter 11, is different from the other filters 12 and 13 in that it includes a synchronizing signal generating means to be described later. Of course, the filters 12 and 13 may include a synchronizing signal generating means like the filter 11.

More particularly, the digital filter 11 is constituted by an arithmetic section 14, an arithmetic control section 15 for controlling the operation in the arithmetic section 14, a coefficient memory 16 serving as a memory circuit to store coefficients or multiplicands for multiplying operations in individual multipliers in the arithmetic section 14, a delay memory section 18 comprising three delay circuits 17a, 17b and 17c and switches 19a and 19b for permitting circulation of signal.

The arithmetic control section 15 has a function of producing various control signals, namely an arithmetic operation clear signal CA, a sampling gate signal SG, a delay memory clock signal DC, a read-out signal coupled to the coefficient memory section 16 and a synchronizing signal SY. The sampling gate signal SG is supplied as switching signal to switches 19a and 19b. The arithmetic section 14 comprises an adder circuit 20a having an input terminal connected to a movable contact 3c of the switch 19a, which has its fixed contact 1c connected to an input terminal IN, an adder circuit 20b receiving the output of the circuit 20a, multipliers 21a and 21b with the input side connected to the output side of the delay circuit 17a which is connected to the output terminal of the adder circuit 20a, the outputs of these multipliers 21a and 21b being supplied to the respective adder circuits 20b and 20a and multipliers 22a and 22b with the input side connected to the output side of the delay circuit 17b which is connected to the output terminal of the delay circuit 17b, the outputs of these multipliers 22a and 22b being supplied to the respective adder circuits 20b and 20a. The switches 19a and 19b are controlled by the sampling gate signal SG from the arithmetic control section 15. When the signal SG is at high level, these switches are respectively in the illustrated state in contact with the contacts 1c, and with change of signal level to low level they are switched to the contacts 2c. The adder circuits 20a and 20b and multipliers 21a, 21b, 22a and 22b are adapted to be cleared with the operation clear signal CA from the arithmetic control section 15. The output of the adder circuit 20b is supplied to the delay circuit 17. Actually, the output of the adder circuits 20a, 20b consists of, for example, 16 bits, and it is converted through a round-off circuit (not shown) into an 8-bit signal which is supplied to the delay circuits 17a, 17c.

Figure 2:
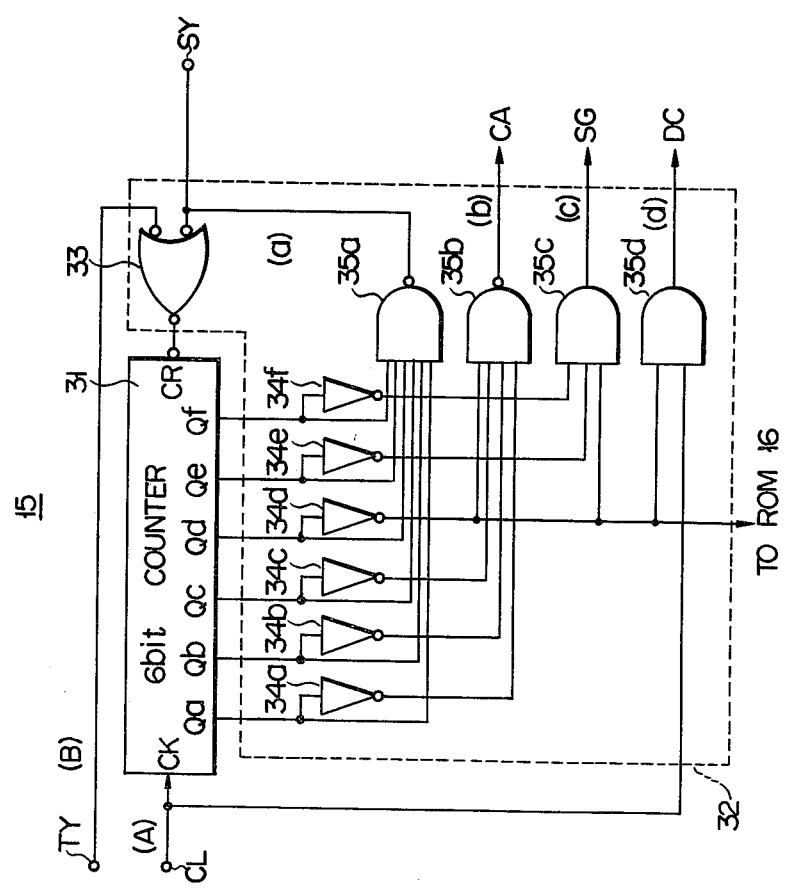
FIG. 2 is a block circuit diagram showing a specific example of the arithmetic control section in the system of FIG. 1.

The coefficients $\alpha_1$, $\beta_1$, $\alpha_2$ and $\beta_2$ for the respective multipliers 21a, 21b, 22a and 22b are provided from the ROM 16 serving as the coefficient memory section, and their values change to $\alpha_1 k$, $\beta_1 k$, $\alpha_2 k$ and $\beta_2 k$ (k being 1, 2, 3, 4) for every arithmetic operation step. As the output command from the arithmetic control section 15 to the ROM 16, an output Qd of a counter circuit 31 as shown in FIG. 2, for instance, is converted through an inverter 34d into a signal $\overline{Qd}$ which is supplied to a decoder within the ROM 16. In this way, the transfer function H(Z) of the digital filter 11 is given as $$H(Z) = \prod_{k=1}^{4} \frac{1 + \alpha_1 k Z^{-1} + \alpha_2 k Z^{-2}}{1 + \beta_1 k Z^{-1} + \beta_2 k Z^{-2}}$$

The delay circuits 17a and 17b in the delay memory section 18 have the function of delaying their respective inputs by a unit period T, and the delay circuit 17c has a function of delaying its input by T/M, i.e., T/4. For example, in case when the length $N_D$ of the digital value (i.e., data) of the sampled signal supplied to the data input terminal TM1 is constituted by, for instance, 8 bits ($N_D$=8), the delay circuits 17a and 17b may be of shift registers of $M \times N_D = 4 \times 8 = 32$ bits, and in this case an output is produced from each of the output terminals of these circuits 17a and 17b for every 8 bits. The delay circuit 17c is constituted by a shift register of N=8 bits. Also in this case, the bit length of the coefficient signals for the multipliers 21a, 21b, 22a, 22b are made $N_C$=8 bits. Thus, denoting the period of the clock signal supplied through an input terminal TM2 to a clock terminal CL by $\tau$, the period required for the multiplying operation in the multipliers 21a, 21b, 22a and 22b is 16$\tau$, and the period required for obtaining the result of operation in one digital filter (unit period T: sampling interval), that is, a period required for four operations, is $16\tau \times 4 = 64\tau$.

A specific example of the arithmetic control section 15 will now be described with reference to FIG. 2. This circuit 15 comprises a 6-bit counter 31 and a control signal generator circuit 32. The control signal generator circuit 32 includes an OR gate 33 having one input terminal connected to a terminal TY receiving a start signal or synchronization signal and its output terminal connected to the clear terminal CR of the counter 31. The counter 31 has a 6-bit construction, and its outputs Qa, Qb, Qc, Qd, Qe and Qf at individual bit positions are supplied to an NAND gate 35a, whose output side is connected to the other terminal of the OR gate 33 and also to a synchronization signal (SY) output terminal. The outputs Qa to Qf are further selectively coupled through inverters 34a to 34f to an NAND gate 35b and AND gates 35c and 35d. The output Qd is further coupled through the inverter 34d to the ROM 16 as shown in FIG. 1; the NAND gate 35b receives the outputs of the inverters 34a to 34d, the AND gate 35c receives the output of the inverters 34d to 34f, and the AND gate 35d receives the output of the inverter 34d and clock signal CL.

Figure 3:
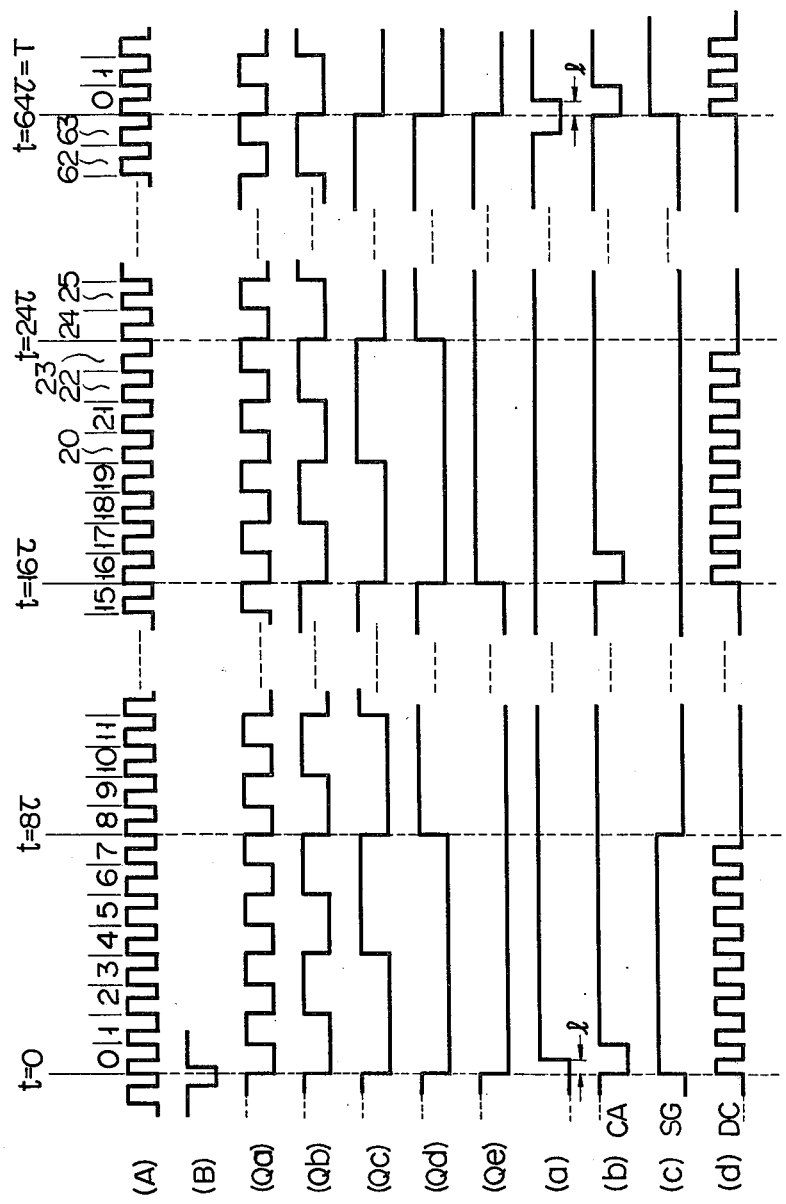
FIG. 3 is a waveform chart for illustrating the operation of the circuit of FIGS. 1 and 2.

The operation of the arithmetic control section 15 shown in FIG. 2 will now be described with reference to FIG. 3. A clock signal CL as shown in A in FIG. 3, appearing at the clock terminal, is coupled to a terminal CK of the counter 31. When a clear pulse of negative polarity, as shown in B in FIG. 3, appears at the terminal TY in the neighborhood of an instant t=0, it is coupled to one of input terminals of the OR gate 33. Since this OR gate 33 is of the type producing output upon reception of the negative input and also since the counter 31 is of synchronized type, upon appearance of a clock pulse at the terminal CK in the presence of signal at the clear terminal CR the content of the counter 31 is cleared at the rising portion of this pulse, that is, at t=0. The counter 31 subsequently counts clock pulses appearing at the terminal CK after t=0 at every rising portion of the pulses. Denoting the period of the clock signal CL by $\tau$, the output Qa of the counter 31 becomes "1" at t=$\tau$. Similarly, the output Qb also becomes "1" at t=2$\tau$. Likewise, the outputs Qa to Qf of the counter 31 have respective waveforms Qa to Qf in FIG. 3.

Since the NAND gate 35a receives all the outputs Qa to Qf, its output a is "0" when all these outputs Qa to Qf are "1", that is, during a period from t=63$\tau$ to t=64$\tau$ (actually it being necessary to take a constant delay period l into considerations). This signal a is supplied to the OR gate 33. The output b of the NAND gate 35 is "0" when the outputs Qa to Qd of the counter 31 are all "0", that is, it is "0" during periods from t=0 to t=$\tau$, from t=16$\tau$ to t=17$\tau$, from t=32$\tau$ to t=33$\tau$ and from t=48$\tau$ to t=49$\tau$. This signal b constitutes the arithmetic operation clear signal CA. The AND gate 35c produces "1" as output c when the outputs Qd, Qe and Qf of the counter 31 are "0", that is, during a period from t=0 to t=8τ. This ouput c constitutes the sampling gate signal SG. The AND gate 35d produces an output of waveform d with clock signal passed and only when the output Qd is "0" and the clock signal is "1", that is, during periods from t=0 to t=8τ, from t=16τ to t=24τ, from t=32τ to t=40τ and from t=48τ to t=56τ. This signal constitutes the delay memory clock signal DC.

The operation of the digital filter 11 in FIG. 1 will now be described with reference to FIG. 3. The clock signal A always prevails at the terminal TM2. When the clear signal B appears at the terminal TM3 immediately before instant t=0, the counter 31 is cleared at t=0 as mentioned earlier. Since at this instant t=0 the switch 19a is closed on the side of the contact 1c by the sampling gate signal SG, 8-bit digital data at the sampling point supplied to the terminal TM1 during a period from t=0 to t=8τ are coupled to the arithmetic section 14 from the least significant bit (LSB). At this time, 8-bit coefficients $\alpha_{11}$, $\beta_{11}$, $\alpha_{21}$ and $\beta_{21}$ are supplied from the memory section 16 to the respective multipliers 21a, 21b, 22a and 22b for multiplication with data of unit period T and double the unit period 2T. This operation is represented by a formula $$\frac{1 + \alpha_{11}Z^{-1} + \alpha_{21}Z^{-2}}{1 + \beta_{11}Z^{-1} + \beta_{21}Z^{-2}}.$$

The above operation is ended at t=16τ, and the result with data length of 16 bits is supplied from the adder 20b to a round-off circuit where it is rounded off to 8 bits to be supplied to the 8-bit delay circuit 17c, and thence it is coupled through the switch 19b, which has been switched to the side of the contact 2c by the sampling gate signal SG of low level, and also through the contact 2c of the switch 19a to the adder 20a. During a period from t=16τ to t=17τ the adder circuits 20a and 20b and multipliers 21a, 21b, 22a and 22b are cleared by the operation clear signal CA, and within a period from t=16τ to t=24τ the result is coupled through the switch 19a to the arithmetic section 14 for operation of the content represented as $$\frac{1 + \alpha_{11}Z^{-1} + \alpha_{21}Z^{-2}}{1 + \beta_{11}Z^{-1} + \beta_{21}Z^{-2}} \cdot \frac{1 + \alpha_{21}Z^{-1} + \alpha_{22}Z^{-2}}{1 + \beta_{12}Z^{-1} + \beta_{22}Z^{-2}}$$

In this way, four operations are executed during the unit period T.

Meanwhile, the terminal CL of the digital filter 11 is connected to the terminals CL of the other digital filters 12 and 13, and the terminal SY of the digital filter 11 is connected to the terminals TY of the other filters 12 and 13. Thus, from the consideration of the delay period l, the output of the OR gate 33 is held "0" during a period from t=63τ+1 to t=64τ+1. During this period the content of the counter 31 of the digital filter 11 is cleared with the clock signal appearing at the terminal CL, and at the same time the similar counters of the other filters 12 and 13 are cleared. This is done so because in the filters 12 and 13 the counters are also cleared upon appearance of the clock signal during the presence of signal "0" at the respective terminals TY.

A terminal OUT of the digital filter 11 is connected to a terminal IN of the digital filter 12, and a terminal OUT of the filter 12 is connected to a terminal IN of the filter 13. Thus, a period 3T afterwards, the operation regarding the transfer function given as $$H(Z) = \prod_{k=1}^{12} \frac{1 + \alpha_{1k}Z^{-1} + \alpha_{2k}Z^{-2}}{1 + \beta_{1k}Z^{-1} + \beta_{2k}Z^{-2}}$$

and the final filter output is obtained at the terminal OUT of the digital filter 13. Further, in the digital filter 11, the operation of the next sampling data is made for every period T.

In the above embodiment, the digital filters 12 and 13 are cleared substantially simultaneously with the filter 11 by the synchronizing signal A obtained therefrom. Where the arithmetic control sections 14 in the digital filters 12 and 13 also have the same construction as shown in FIG. 2, the synchronizing signal supplied to the terminals TY of these filters from the digital filter 11 and that supplied to the filter 11 itself are coupled to the respective counters in the exact sense, but these signals are coupled substantially simultaneously so that there is no problem. However, if it is arranged such as to clear the counters by the sole synchronizing signal of the digital filter 11 with the provision of gate circuit or like means, more perfect synchronization of the three filters 11 to 13 can be obtained.

Figure 4:
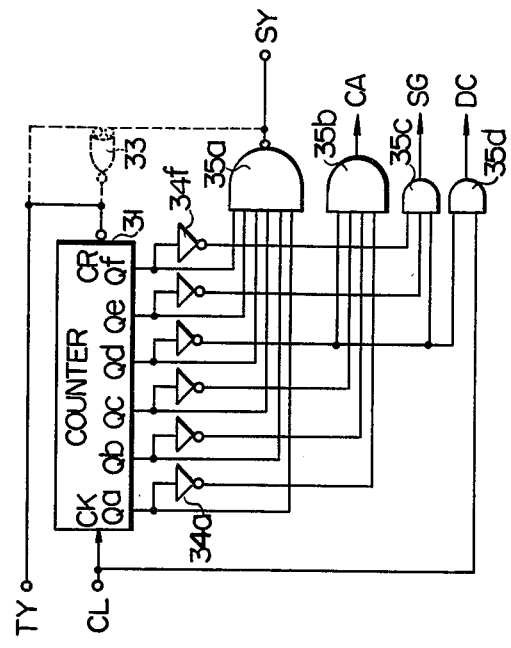
FIG. 4 is a block circuit diagram showing another example of the arithmetic control section shown in FIG. 1.

Further, in the above embodiment the clear signal supplied to the terminal TY and the synchronizing signal obtained as the output of the NAND gate 35a are coupled through the OR gate 33 to the clear terminal CR of the counter 31. However, where the counter 31 executes one cycle of $2^n$ (here n being 6), its content is rendered zero with the next clock pulse, so that in this case the synchronizing signal may not be coupled to the terminal CR. This means that the OR gate 33 is unnecessary, that is, the portion shown by dashed lines in FIG. 4 is not required in this case. The other construction is the same as in the case of FIG. 2.

While the cases with multiplication degree of M=4 and with counters 31 of $2^6$=scale of 64 have been described above in connection with FIGS. 2 and 4, similar effects can also be obtained where M is variable, that is, by using variable counters. For example, where the data word length $N_D$ is 8 bits, the coefficient word length $N_C$ is also 8 bits, the multiplication period is $L=N_D+N_C=16\tau$ (τ being the clock rate), and M is variable (with a maximum value of 4), then, T=ML. If $m_1$ and $m_2$ are multiplication degree (M) specification signals, the relation among $m_1$, $m_2$ and M are as shown in the Table below.

| M | $m_2$ | $m_1$ |
|---|---|---|
| 1 | 0 | 0 |
| 2 | 0 | 1 |
| 3 | 1 | 0 |
| 4 | 1 | 1 |

In this case, the counter operates as a scale of 16, 32, 48 or 64 depending upon $m_1$ and $m_2$.

Figure 5:
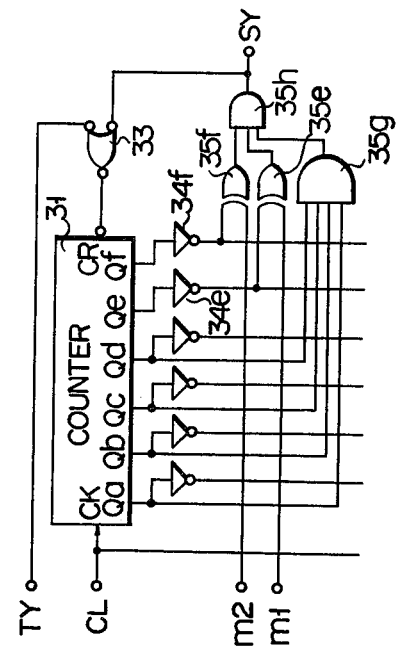
FIG. 5 is a block circuit diagram showing a modification of the circuit of FIG. 4, with the counter in this example made variable.

FIG. 5 shows an example of the circuit of this case. Here, inputs $m_1$ and $m_2$ are coupled together with respective outputs of inverters 34e and 34f inverting the outputs Qe and Qf of the counter 31 to the input side of respective exclusive OR gates 35e and 35f. The outputs of the exclusive OR gates 35e and 35f. The output of the exclusive OR gates 35e and 34f are coupled together with the output of the AND gate 35g to the input side of an NAND gate 35h, the output of which is coupled as one input to an NOR gate 33 and also supplied as synchronizing output signal SY similar to the case of FIG. 2. In case when, for instance, $M=3$, i.e., $m_1=0$ and $m_2=1$, with the output of the counter 31 $Qe="0"$ and $Qf="1"$, the exclusive OR gate 35e produces output "1" in response to the two inputs $\overline{Qe}="1"$ and $m_1="0"$, and the exclusive OR gate 35f also produces output "1" in response to the two inputs $\overline{Qf}="0"$ and $m_2="1"$. Thus, in this case, with the "1" output of the AND gate 35g during the period of from $47\tau$ to $48\tau$, the NAND gate 35h produces "0" output, and the counter 31 operates as a scale of 48. The synchronizing signal SY is produced when the content of the counter 31 is between $47\tau$ and $48\tau$, and the counters of the digital filters 11 to 13 are cleared to "0" with the rising of the $48\tau$ clock pulse.

While the description so far has concerned with the cases where synchronized type clear action of the counters 31 is made, the invention can be applied as well to cases where non-synchronized type clear is effected (with the counters being forcibly cleared at an instant of appearance of the clear signal).

Figure 6:
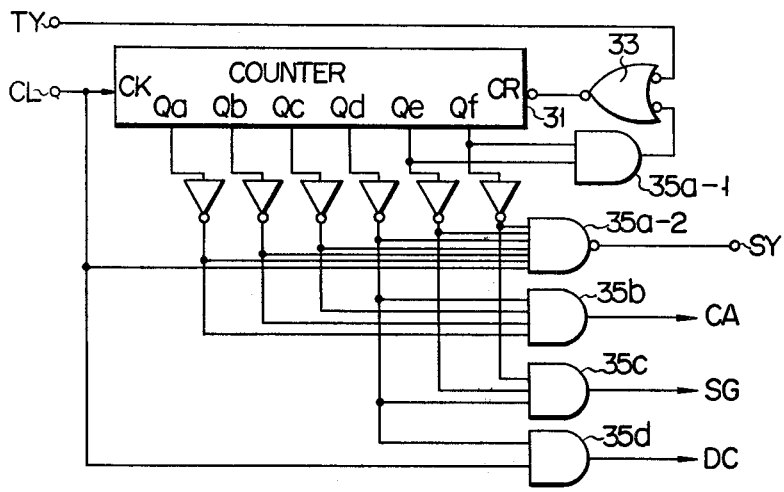
FIG. 6 is a block circuit diagram showing a further example of the arithmetic control section shown in FIG. 1.
Figure 7:
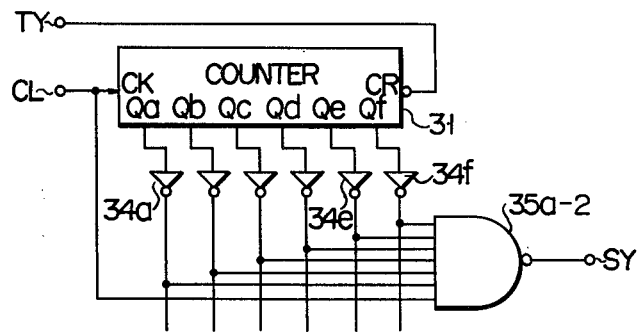
FIG. 7 is a block circuit diagram showing a modification of the circuit of FIG. 6.

FIG. 6 shows a specific example of the operation control section of the non-synchronized type clear system with multiplication degree of $M=3$. The same parts as those in FIG. 2 are designated by like reference numerals. This arrangement is different from that of FIG. 2 only in that the NAND gate 35a in FIG. 2 is replaced with an AND gate 35a-1 and an NAND gate 35a-2. The AND gate 35a-1 receives the outputs Qe and Qf of the counter 31, and when both of its inputs are "1" the counter 31 is cleared so that all the outputs Qa to Qf of the counter 31 become "0". Thus, when the clock signal appears at the terminal CL, the output of the NAND gate 35a-2 becomes "0", and this pulse is coupled through the terminal SY to the terminals TY of the digital filters 12 and 13, and at this instant these filters 12 and 13 are forcibly cleared. In this way, synchronization of the entire digital filter system is obtained.

Where the cycle of the counter 31 is $2^n$ (here $n=6$), the counter 31 is reset to "0" with the next clock pulse $(2^n+1)$th, so that in this case the AND gate 35a-1 in FIG. 6 may be omitted. In this case, the circuit is extremely simplified as shown in FIG. 7. In this circuit, the counter 31 is reset with the 64th clock pulse, with all its outputs Qa to Qf becoming "0", and the output of the NAND gate 35a-2 also becomes "0" simultaneously. In this case, the terminal TY is directly connected to the clear terminal CR of the counter 31.

Figure 8:
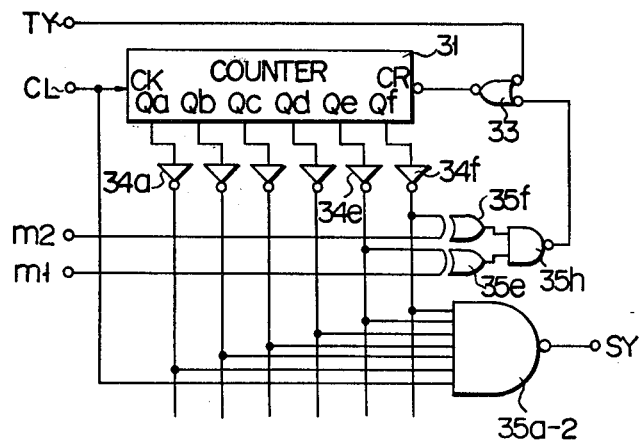
FIG. 8 is a block circuit diagram showing another modification of the circuit of FIG. 6.

FIG. 8 shows an example of the circuit using a variable counter (of non-synchronized clear type) of a type of the scale of $2^n$. In this case, the relation among the multiplication degree M and multiplication degree specification signals $m_1$ and $m_2$ is as shown in the Table below.

| M | $m_1$ | $m_2$ |
|---|-------|-------|
| 1 | 0 | 0 |
| 2 | 0 | 1 |
| 3 | 1 | 0 |
| 4 | 1 | 1 |

The counter 31 operates as scales of 16, 32, 48 or 64 depending upon whether $m_1$ and $m_2$ are "1" or "0". For instance, when $m_1=1$ and $m_2=1$, with $Qe="1"$ and $Qf="1"$ both the outputs of the exclusive OR gates 35e and 35f become "1", so that the output of NAND gate 35h becomes "0" to clear the counter 31. Thus, at the same time the synchronizing signal SY is produced at the timing of the 48th clock pulse for simultaneously clearing the other digital filters 12 and 13.

Where the number of the clock signals required for the multiplication is other than $2^n$, for instance 14, the counter 31 may consist of a cascade connection of a scale of L counter and a scale of M counter, with L being the number of the clock signals and M being the multiplication degree. In case of the synchronized type clear, the synchronizing signal SY may be produced when the contents of the scale of L and scale of M counters are respectively $L-1$ and $M-1$. In case of the non-synchronized type clear, the synchronizing signal may be produced when both the scale of L and scale of M counters provide "0".

While the above description has concerned with the use of cyclic digital filters connected in cascade, it is also possible to use non-cyclic digital filters and also employ parallel connection or ladder type connection. In general, the invention can be applied to information transmission systems in which a plurality of digital filters are synchronized by a clock signal. Where the individual digital filters have different operation periods, the timing of synchronization may be set with respect to the longest operation period.

As has been described in the foregoing, since according to the invention a synchronizing signal produced after the end of operation on one digital filter is supplied to the counters of the other digital filters, it is possible to obtain synchronization of digital filters reliably for every unit operation period, and erroneous operation is thus less likely to result. Further, even if departure from synchronization takes place, it is confined only within the relevant unit operation period so that it has no substantial effect.

What we claim:

1. A digital filter system comprising a plurality of digital filters having respective counters operated by the same clock signal, at least one of said digital filters including an arithmetic control section having one of said counters to count said clock signal and be cleared with a clear signal and a circuit to produce a control signal according to the content of said one counter, a coefficient memory to produce predetermined coefficients according to an output of said arithmetic control section, an arithmetic section to carry out predetermined arithmetic operations with said coefficients under the control of the control signal received from said arithmetic control section, and a circuit to produce a synchronizing signal at the time of end of the operation in said arithmetic section, said synchronizing signal being supplied to clear terminals of the other counters of all the other digital filters to effect synchronization of all said digital filters.

2. The digital filter system according to claim 1, wherein said one counter is a scale of $2^n$ counter, said clear signal being given to said one counter when $2^n-1$ clock pulses are counted by said one counter, said clear signal being also used as said synchronizing signal.

3. The digital filter system according to claim 1, wherein said one counter is a variable counter controlled by a multiplication degree specification signal, said clear signal being produced according to said multiplication degree specification signal and used to forcibly clear the other counters, said clear signal being also used as said synchronizing signal.

4. The digital filter system according to claim 1, wherein said one counter is a scale of $2^n$ counter, said clear signal being given to the other counters when $2^n$ clock pulses are counted by said one counter, said synchronizing signal being produced in accordance with the output of said one counter in the cleared state and also with the $(2^n+1)$th clock pulse.

5. The digital filter system according to claim 1, wherein said one counter is a scale of $2^n$ counter and is reset when $2^n$ clock pulses are counted by it, said synchronizing signal being produced in accordance with the output of said one counter in the cleared state and also with the next $(2^n+1)$th clock signal.

6. The digital filter system according to claim 1, wherein said one counter is a variable counter controlled by a multiplication degree specification signal and is cleared with a clear signal produced according to said multiplication degree specification signal, said synchronizing signal being produced in accordance with the output of said one counter in the cleared state and also with the next clock pulse.

7. The digital filter system accoring to claim 1, wherein said coefficient memory is a read-only memory.

8. The digital filter system according to claim 1, wherein said at least one digital filter further includes first and second switches and a delay memory section to memorize the output of said arithmetic section, said arithmetic control section including means for producing a sampling gate signal for controlling said first and second switches and means for producing a delay memory clock signal for controlling said delay memory section and an operation clear signal for controlling operational elements in said arithmetic section according to the content of said one counter.

* * * * *